United States Patent
Ding et al.

(10) Patent No.: US 8,766,654 B2
(45) Date of Patent: Jul. 1, 2014

(54) PACKAGE STRUCTURE WITH CONFORMAL SHIELDING AND INSPECTION METHOD USING THE SAME

(75) Inventors: Jaw-Ming Ding, Taoyuan County (TW); Chien-Yeh Liu, Hsinchu County (TW); Chih-Hao Chiang, Hsinchu County (TW)

(73) Assignees: Universal Scientific Industrial Co., Ltd., Shanghai (CN); Universal Global Scientific Industrial Co., Ltd., Nantou County (TW)

( * ) Notice: Subject to any disclaimer, the term of this patent is extended or adjusted under 35 U.S.C. 154(b) by 191 days.

(21) Appl. No.: 13/430,759

(22) Filed: Mar. 27, 2012

(65) Prior Publication Data
US 2013/0257462 A1 Oct. 3, 2013

(51) Int. Cl.
*G01R 27/08* (2006.01)
(52) U.S. Cl.
USPC ............ 324/705; 257/659; 257/660; 438/123
(58) Field of Classification Search
USPC .......... 324/705, 691, 696, 525; 257/508, 621, 257/659, 662, 664; 438/124
See application file for complete search history.

(56) References Cited

U.S. PATENT DOCUMENTS

| | | | | |
|---|---|---|---|---|
| 5,639,989 A * | 6/1997 | Higgins, III | ................. | 174/386 |
| 7,719,302 B2 * | 5/2010 | Hsu et al. | ................. | 324/754.01 |
| 7,932,717 B2 * | 4/2011 | Beach et al. | ................. | 324/210 |
| 7,968,979 B2 * | 6/2011 | Pagaila et al. | ................. | 257/660 |
| 8,063,656 B1 * | 11/2011 | Ubaldo et al. | ............ | 324/763.01 |
| 2009/0315156 A1 * | 12/2009 | Harper | ......................... | 257/660 |
| 2010/0032693 A1 * | 2/2010 | Sugiura et al. | ................. | 257/88 |
| 2012/0015687 A1 * | 1/2012 | Yamada et al. | ............ | 455/550.1 |
| 2012/0052630 A1 * | 3/2012 | Lin et al. | ........................ | 438/108 |
| 2012/0241922 A1 * | 9/2012 | Pagaila | ......................... | 257/659 |

* cited by examiner

*Primary Examiner* — Arleen M Vazquez
*Assistant Examiner* — Neel Shah
(74) *Attorney, Agent, or Firm* — Bacon & Thomas, PLLC

(57) ABSTRACT

A package structure with conformal shielding includes a substrate providing electrically connected inner grounding structures, a chip module mounted on the substrate, a molding compound covering the chip module and one surface of the substrate, and a conductive shielding layer covering the molding compound and the lateral sides of the substrate, and electrically connected with a part of the inner grounding structures. The substrate further provides one or multiple independent conductive structures electrically connected with the conductive shielding layer and exposed to the outside. By measuring the resistance value between one independent conductive structure and the conductive shielding layer or another independent conductive structure or one ground contact and then comparing the measured resistance value with a predetermined reference value, the EMI shielding performance of the package structure is determined.

4 Claims, 4 Drawing Sheets

PACKAGE STRUCTURE WITH CONFORMAL SHIELDING AND INSPECTION METHOD USING THE SAME

BACKGROUND OF THE INVENTION

1. Field of the Invention

The present invention relates to EMI (electromagnetic interference) shielding technology of using conformal shielding in package process to prevent EMI and more particularly, to a package structure with conformal shielding and inspection method using the same that is practical for conformal shielding application as well as compartment shielding application.

2. Description of the Related Art

The technique of conformal shielding is to form a conductive shielding layer on the periphery of an electronic module by means of sputtering, spray coating or any other film coating technique. Prior to the film coating step, the fabrication of the electronic module employs a substrate cutting step. After the substrate cutting step, many inner grounding structures are exposed to the outside of the substrate. After covered on the module, the conductive shielding layer is electrically connected with the inner grounding structures to protect the circuits of the module against external electromagnetic noises.

However, a substrate cutting failure, uneven thickness of the conductive shielding layer or improper connection between the conductive shielding layer and the inner grounding structures may lead to poor shielding performance. To ensure the quality of conformal shielding, shielding performance inspection of every fabricated package structure must be inspected by means of X-ray scanning or destructive cross-sectional inspection. As a result, it needs to use an expensive X-ray scanner, or to destruct the finished product, increasing the amount of waste material. An improvement in this regard is necessary.

SUMMARY OF THE INVENTION

The present invention has been accomplished under the circumstances in view. It is the main object of the present invention to provide a package structure with conformal shielding and inspection method using the same, which facilitates accurate examination of the EMI (electromagnetic interference) shielding performance of a package structure with a simple resistance meter without using an expensive X-ray scanner or destructing the product.

To achieve this and other objects of the present invention, a package structure with conformal shielding comprises a substrate, at least one chip module mounted on the substrate, a molding compound covering the at least one chip module and one surface of the substrate, and a conductive shielding layer covering the molding compound. The substrate comprises a plurality of inner grounding structures electrically connected to one another, a predetermined number of the inner grounding structures being electrically connected with the conductive shielding layer, and at least one independent conducting structure electrically connected with the conductive shielding layer and exposed to the outside of the substrate.

Preferably, at least one the independent conducting structure is disposed at each of the multiple lateral edges of the substrate.

In the case that multiple chip modules are used and multiple separate compartments for EMI shielding between the chip modules are necessary, at least one independent conducting structure should be set between the chip modules. In this case, the substrate further comprises a first conductor electrically connected with the at least one independent conducting structure, and the molding compound comprises a groove and a second conductor mounted in the groove and electrically connected with the first conductor and the conductive shielding layer.

To achieve this and other objects of the present invention, a package structure inspection method comprises the steps of: a) providing a package structure, wherein the package structure comprises a substrate, at least one chip module mounted on the substrate, a molding compound covering the at least one chip module and one surface of the substrate, and a conductive shielding layer covering the molding compound; the substrate comprises a plurality of inner grounding structures electrically connected to one another, and at least one independent conducting structure exposed to the outside of the substrate, the at least one independent conducting structure and a predetermined number of the inner grounding structures being electrically connected with the conductive shielding layer; and b) measuring the resistance value between one independent conducting structure and the conductive shielding layer or another independent conducting structure or a ground contact of the substrate and then comparing the measured resistance value with a predetermined reference value.

Further, the ground contact is electrically connected with the inner grounding structures or a grounding layer in the substrate and exposed to the outside of the substrate.

After fabrication, the package structure is inspected by means of the aforesaid inspection method. If the measured value is greater than the reference value, it means a cutting failure or coating failure of the package structure, or a connection failure of the conductive shielding layer, or an uneven distribution of the thickness of the conductive shielding layer. The EMI (electromagnetic interference) shielding performance of the package structure can be judged to be good as long as every measured resistance value is smaller than or equal to the reference value.

Other advantages and features of the present invention will be fully understood by reference to the following specification in conjunction with the accompanying drawings, in which like reference signs denote like components of structure.

DETAILED DESCRIPTION OF THE INVENTION

Figure 1:
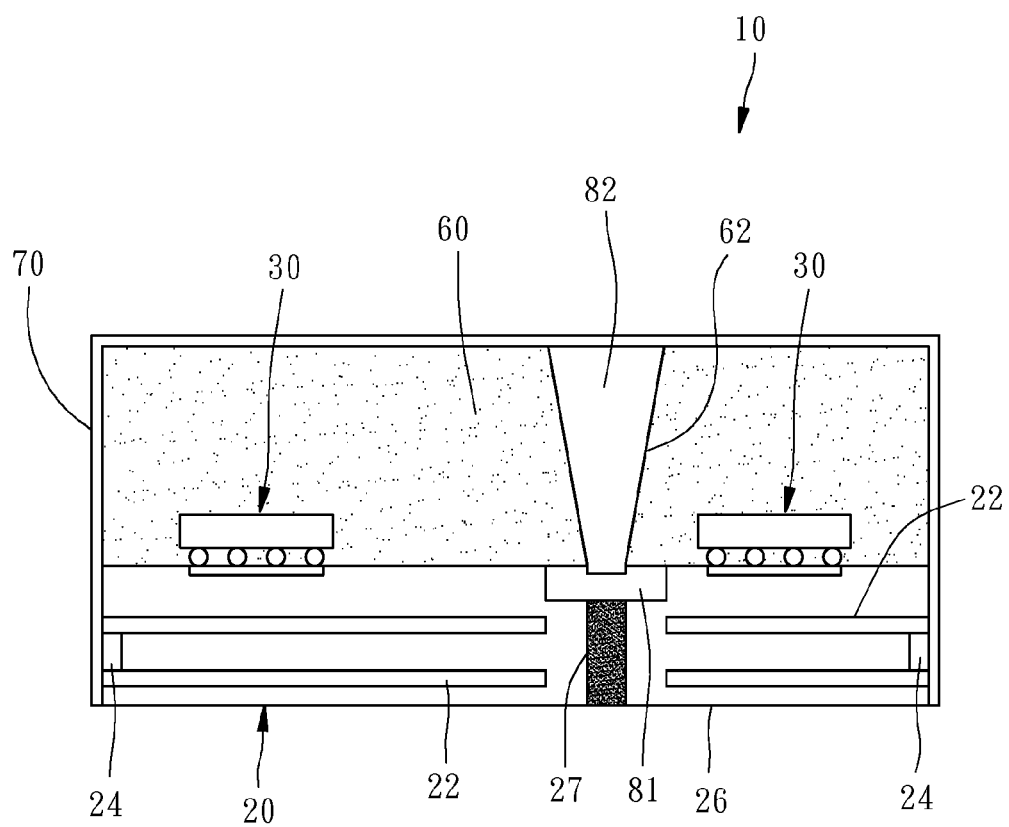
FIG. 1 is a schematic sectional view of a package structure with conformal shielding in accordance with a first embodiment of the present invention.
Figure 2:
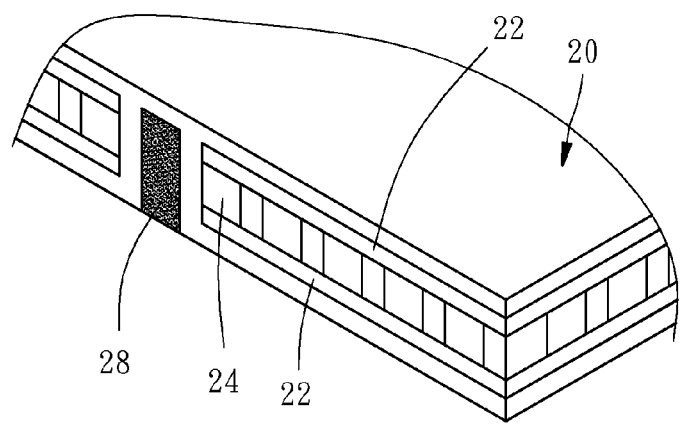
FIG. 2 is a schematic side elevation of a part of the substrate of the package structure with conformal shielding in accordance with the first embodiment of the present invention.
Figure 3:
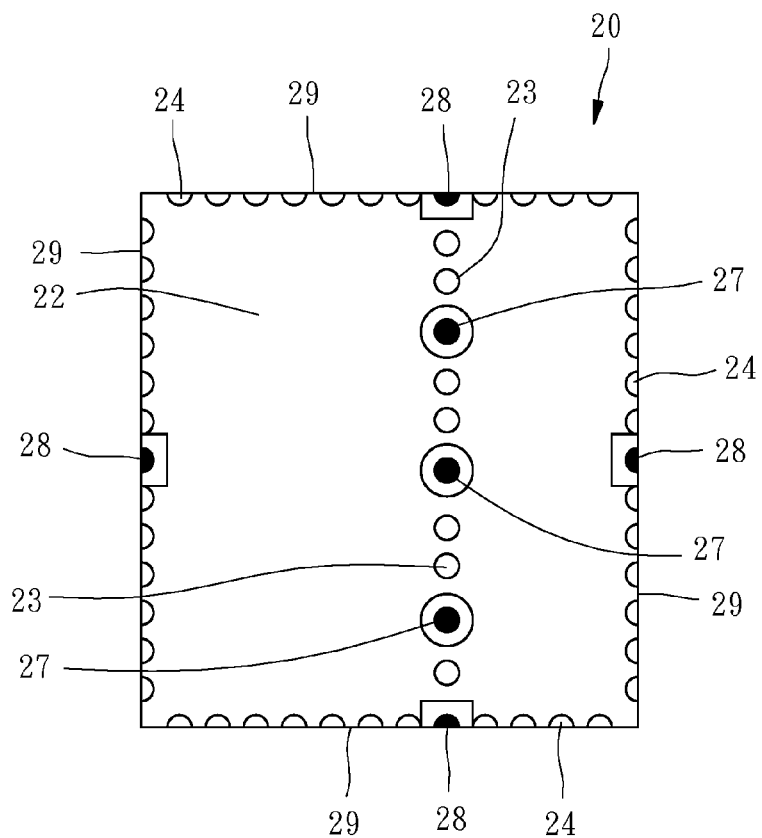
FIG. 3 is a schematic drawing illustrating one ground layer of the substrate of the package structure with conformal shielding in accordance with the first embodiment of the present invention.
Figure 4:
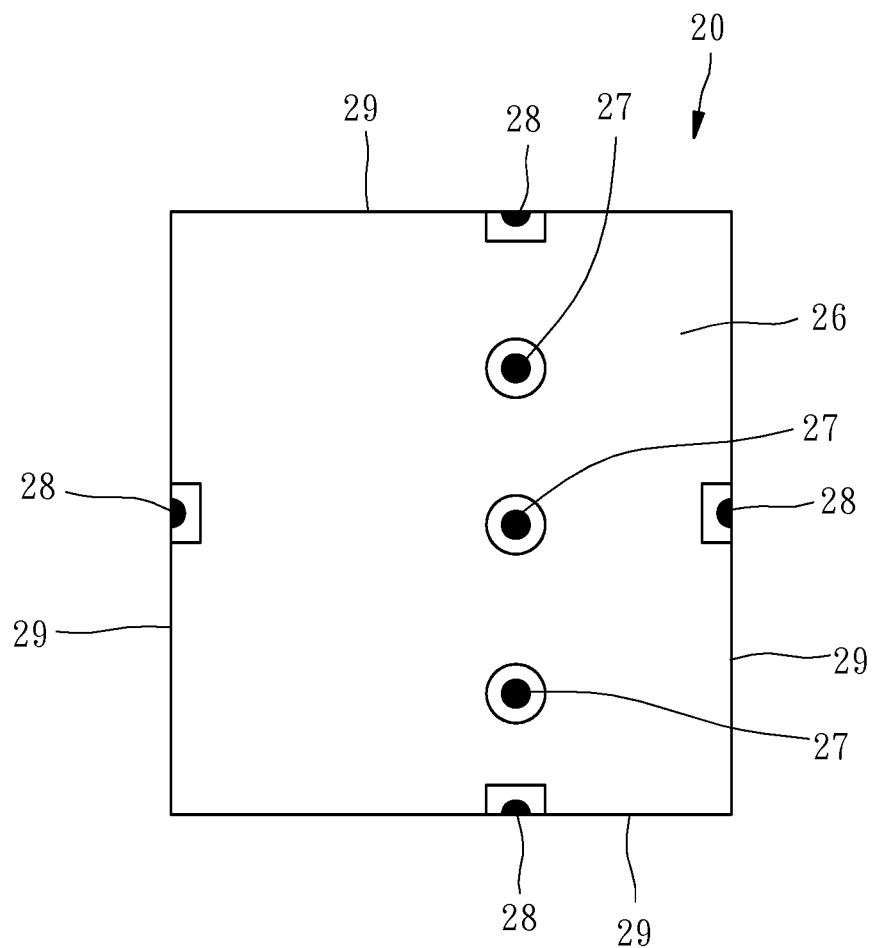
FIG. 4 is a schematic bottom view of the substrate of the package structure with conformal shielding in accordance with the first embodiment of the present invention.

The advantages and features of the present invention will be fully understood by reference to the following two examples in conjunction with the accompanying drawings.

Referring to FIG. 1 through FIG. 4, a package structure with conformal shielding 10 in accordance with a first embodiment of the present invention is shown. The package structure with conformal shielding 10 comprises a substrate 20, at least one, for example, two chip modules 30 mounted on the substrate 20, a molding compound 60 covering the chip modules 30, and a conductive shielding layer 70 covering the molding compound 60 and the lateral edges of the substrate 20.

The substrate 20 is similar to a conventional multilayer PC board, comprising at least one ground layer 22 set therein, and a plurality of inner grounding structures 23, 24 inserted through respective ground vias therein and electrically connected to the at least one ground layer 22. The aforesaid ground vias can be through holes, blind holes, countersunk holes, or other similar structures and their combinations. Further, the inner grounding structures 23, 24 can be any of a variety of conductive connection components and their combinations that are commonly seen in multilayer PC boards, and are electrically connected one another by means of the at least one ground layer 22.

The chip modules 30 are electrically coupled to the substrate 20. The ground pin (not shown) of each chip module 30 is electrically connected to one of the inner grounding structures 23, 24 or one ground layer 22.

Referring to FIG. 2 again, the difference between the substrate 20 of the present invention and the substrates of prior art designs is that the substrate 20 of the present invention further comprises a plurality of independent conducting structures 27, 28. Unlike the inner grounding structures 23, 24, these independent conducting structures 27, 28 are isolated from the at least one ground layer 22 and exposed to the bottom surface 26 of the substrate 20.

Further, it is to be noted that the independent conducting structures 27, 28 in this embodiment are extended between the opposing top surface and bottom surface of the substrate 20, however, the independent conducting structures 27, 28 can be designed not to extend to the top surface and the bottom surface of the substrate 20, or respectively connected to the top and bottom surface by a respective trace. This will be discussed later.

Further, to avoid electromagnetic interference between the two chip modules 30 in this embodiment, the inner grounding structures 23 and the independent conducting structures 27 are set between the two chip modules 30. The substrate 20 further comprises a first conductor 81 (for example, copper foil) set on the top side thereof and electrically connected with the inner grounding structures 23 and the independent conducting structures 27. After installation of the chip modules 30 in the substrate 20, the molding compound 60 is molded on the substrate 20 to encapsulate the chip modules 30, and then a laser implement is operated to cut a groove 62 in the molding compound 60 subject to a predetermined path, thereby exposing the first conductor 81. Thereafter, a conducting material (for example, silver glue) is filled in the groove 62 to form a second conductor 82. Thereafter, the molding compound 60 and the substrate 20 are cut into a predetermined shape, and then the conductive shielding layer 70 is formed on the surface the molding compound 60 and the surface of the second conductor 82 and the lateral edges of the substrate 20 by means of sputtering, spray coating or any other film coating technique.

After the aforesaid cutting step, the inner grounding structures 24 and the independent conducting structures 28 are cut off and disposed at the border of the substrate 20, and electrically connected with the later-formed conductive shielding layer 70. The inner grounding structures 23 and the independent conducting structures 27 that are not disposed at the border of the substrate 20 are not cut off at this time, however, they are kept electrically connected to the conductive shielding layer 70 by means of the first conductor 81 and the second conductor 82. The conductive shielding layer 70 can prevent electromagnetic interference between the two chip modules 30 and protect the chip modules 30 of the package structure 10 against external electromagnetic noises providing that the inner grounding structures 24 and the independent conducting structures 28 are cut off, the thickness of the conductive shielding layer 70 is evenly distributed and properly connected with the inner grounding structures 24, the independent conducting structures 28 and the second conductor 82.

In case, the package structure 10 simply comprises one single chip module 30, or there is no any electromagnetic interference problem between the chip modules 30, the inner grounding structures 23, independent conducting structures 27, first conductor 81 and second conductor 82 can be omitted, achieving the same advantages of low cost and testing convenience.

After fabrication of the aforesaid package structure, the conductivity between the independent conducting structures 27, 28 and the conductive shielding layer 70 can be decided simply by means of measuring the resistance value between one of the independent conducting structures 27, 28 and the conductive shielding layer 70 and then comparing the measured resistance value with a predetermined reference value, for example, 1 ohm.

Thus, any cutting failure or coating failure of the package structure 10 can be examined by means of measuring the resistance value between every independent conducting structure 27, 28 and the conductive shielding layer 70. The EMI (electromagnetic interference) shielding performance of the package structure 10 can be judged to be good as long as every measured resistance value is smaller than or equal to the reference value. If any measured resistance value is greater than the reference value, a further more sophisticated testing of the package structure 10 will be necessary.

Alternatively, the conductivity between the independent conducting structures 27, 28 and the conductive shielding layer 70 or between either two of the independent conducting structures 27, 28 can be decided by measuring the resistance value, and checking whether or not the measured resistance value is below the predetermined reference value. Thus, any cutting failure or coating failure of the package structure 10 can be examined by means of measuring the resistance value between any two independent conducting structure 27, 28 to have every independent conducting structure 27, 28 be measured. The EMI (electromagnetic interference) shielding performance of the package structure 10 can be judged to be good as long as every measured resistance value is smaller than or equal to the reference value.

It is to be noted that in the aforesaid inspection method, it is not imperative to predetermine the reference value. For example, after measurement of all resistance values, the reference value can be determined subject to the measured resistance values, i.e., if most measured resistance values are similar and relatively smaller and a few of the measured resistance values is relatively larger, the largest one of the major group of relatively smaller resistance values can be used as a reference value.

In the aforesaid embodiment, each of the four cut sides of the substrate 20 comprises at least one of the independent conducting structures 28, and the independent conducting structures 27 are set between the inner grounding structures 23. Thus, the quality of the package structure 10 and the location of any product defectiveness, if any, can be accurately determined by means of applying the aforesaid method to measure the resistance of the independent conducting structures 27, 28. However, there is no restriction on the amount and installation locations of the independent conducting structures 27, 28 of the package structure 10, and, it is not imperative to measure every independent conducting structure 27, 28.

Figure 5:
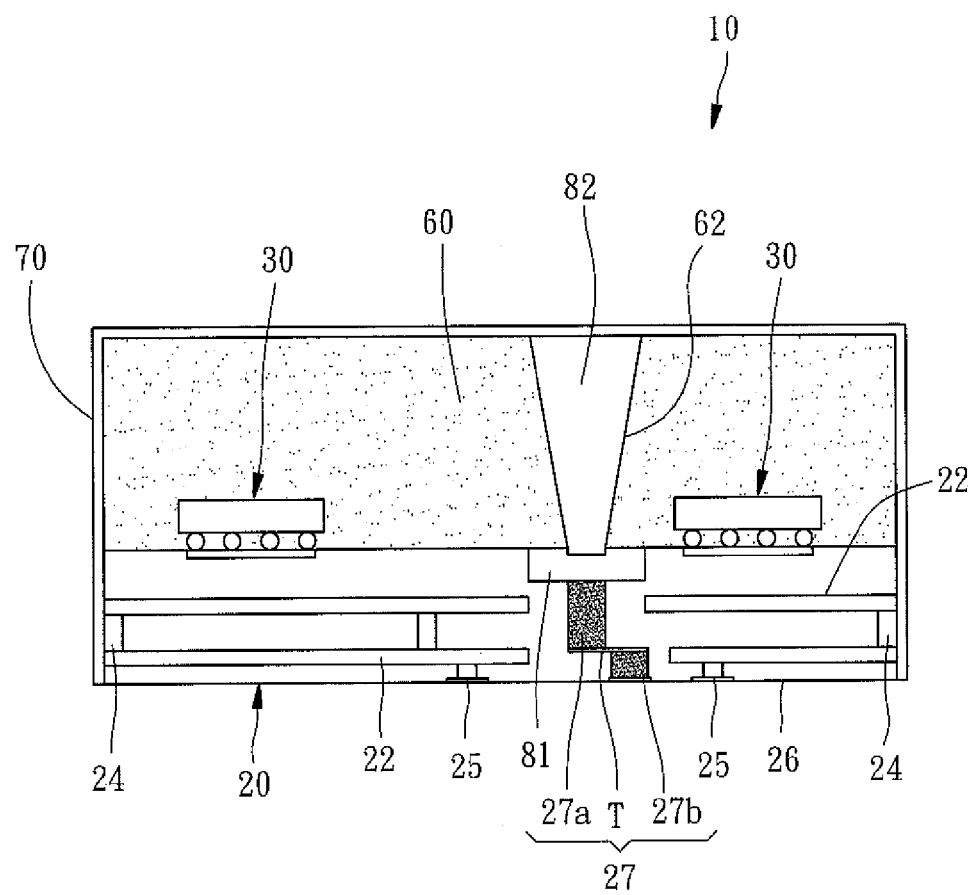
FIG. 5 is a schematic sectional view of a package structure with conformal shielding in accordance with a second embodiment of the present invention.

FIG. 5 illustrates a package structure with conformal shielding in accordance with a second embodiment of the present invention. This second embodiment is substantially similar to the aforesaid first embodiment with the exception that each independent conducting structure 27 is formed of multiple segments 27a, 27b that are connected together by a trace T, and electrically connected to the conductive shielding layer 70 by the first conductor 81 and the second conductor 82; the substrate 20 further comprises at least one, for example, two ground contacts 25 located on the bottom surface thereof and connected with the inner grounding structures or ground layer. Thus, the EMI (electromagnetic interference) shielding performance of the package structure 10 can be judged by means of measuring the resistance value between the independent conducting structures 27 or 28 and any ground contact 25.

Further, in this second embodiment, the independent conducting structures 27, 28 can be formed of multiple segments without departing from the spirit and scope of the invention.

By means of the package structure with conformal shielding 10 and inspection method provided by the present invention, the EMI (electromagnetic interference) shielding performance of the package structure 10 can be examined quickly with a simple resistance meter without using an expensive X-ray scanner or destructing the product. Thus, all the products can be inspected individually, avoiding possible errors in sampling inspection.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A package structure inspection method, comprising the steps of:
    a) providing a package structure, said package structure comprising a substrate, at least one chip module mounted on said substrate, a molding compound covering said at least one chip module and one surface of said substrate, and a conductive shielding layer covering said molding compound and at least a part of lateral edges of said substrate, said substrate comprising a plurality of inner grounding structures electrically connected to one another and at least one independent conducting structure exposed to the outside of said substrate, said at least one independent conducting structure and a predetermined number of said inner grounding structures being electrically connected with said conductive shielding layer; and
    b) measuring the resistance value between said at least one independent conducting structure and said conductive shielding layer and then comparing the measured resistance value with a predetermined reference value.

2. The package structure inspection method as claimed in claim 1, wherein the package structure provided in step a) comprises a plurality of independent conducting structures; said step b) is to measure the resistance value between any two of said independent conducting structures and then comparing the measured resistance value with the predetermined reference value.

3. The package structure inspection method as claimed in claim 1, wherein the package structure provided in step a) further comprises at least one ground contact electrically connected with said inner grounding structures or a grounding layer in said substrate and exposed to the outside of said substrate; said step b) is to measure the resistance value between said at least one independent conducting structure and said at least one ground contact and then comparing the measured resistance value with the predetermined reference value.

4. The package structure inspection method as claimed in claim 2, wherein at least one said independent conducting structure is disposed at each the lateral edges of said substrate.

* * * * *